United States Patent [19]

Mazur

[11] Patent Number: 4,512,855
[45] Date of Patent: Apr. 23, 1985

[54] DEPOSITION OF METALS AS INTERLAYERS WITHIN ORGANIC POLYMERIC FILMS

[75] Inventor: Stephen Mazur, Wilmington, Del.

[73] Assignee: E. I. Du Pont de Nemours and Company, Wilmington, Del.

[21] Appl. No.: 633,502

[22] Filed: Jul. 23, 1984

[51] Int. Cl.³ ............................................... C25D 7/00
[52] U.S. Cl. ........................................ 204/22; 204/20; 204/130; 427/256; 427/282; 427/283; 427/12; 427/35; 428/458
[58] Field of Search ............................ 204/20, 22, 130; 427/256, 282, 283, 12, 35; 428/458

[56] References Cited

U.S. PATENT DOCUMENTS 3,407,125 10/1968 Fehlner .................................. 204/22
3,549,505 12/1970 Hanusa ................................... 204/22

FOREIGN PATENT DOCUMENTS

WO83/02368 7/1983 PCT Int'l Appl. .

OTHER PUBLICATIONS

C. K. Chiang, Polymer, 22, 1454, (1981).
J. A. Bruce, J. Murahashi, and M. S. Wrighton, *J. Phys. Chem.*, 86, 1552, (1982).
J. A. Bruce and M. S. Wrighton, *J. Am. Chem. Soc.*, 104, 74, (1982).
P. G. Pickup, K. M. Kuo and R. J. Murray, *J. Electrochem. Soc.*, 130, 2205, (1983).
R. W. Berry, P. M. Hall, and M. T. Harris, "Thin Film Technology", D. van Nostrand Co., Inc.; Princeton, NJ, 1968, pp. 1–17.
A. Roff and E. Weyde, "Photographic Silver Halide Diffusion Processes", The Focal Press, London and New York, 1972, pp. 13–31.
R. C. Haushalter and L. J. Krause, *Thin Solid Films*, 102, 161, (1983).

*Primary Examiner*—R. L. Andrews

[57] ABSTRACT

Metal interlayer deposition process for depositing a metal in its zero-valent state in a spatially-controlled manner within an organic polymeric film.

34 Claims, 9 Drawing Figures

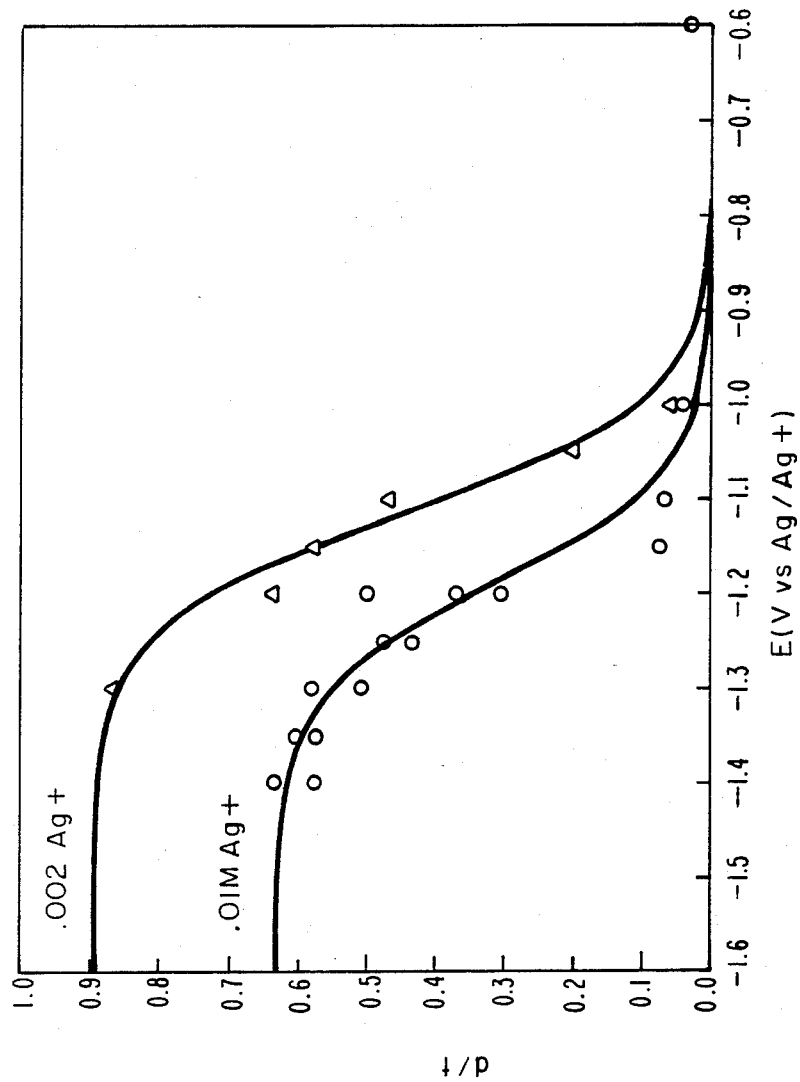

1μ

F I G. 9
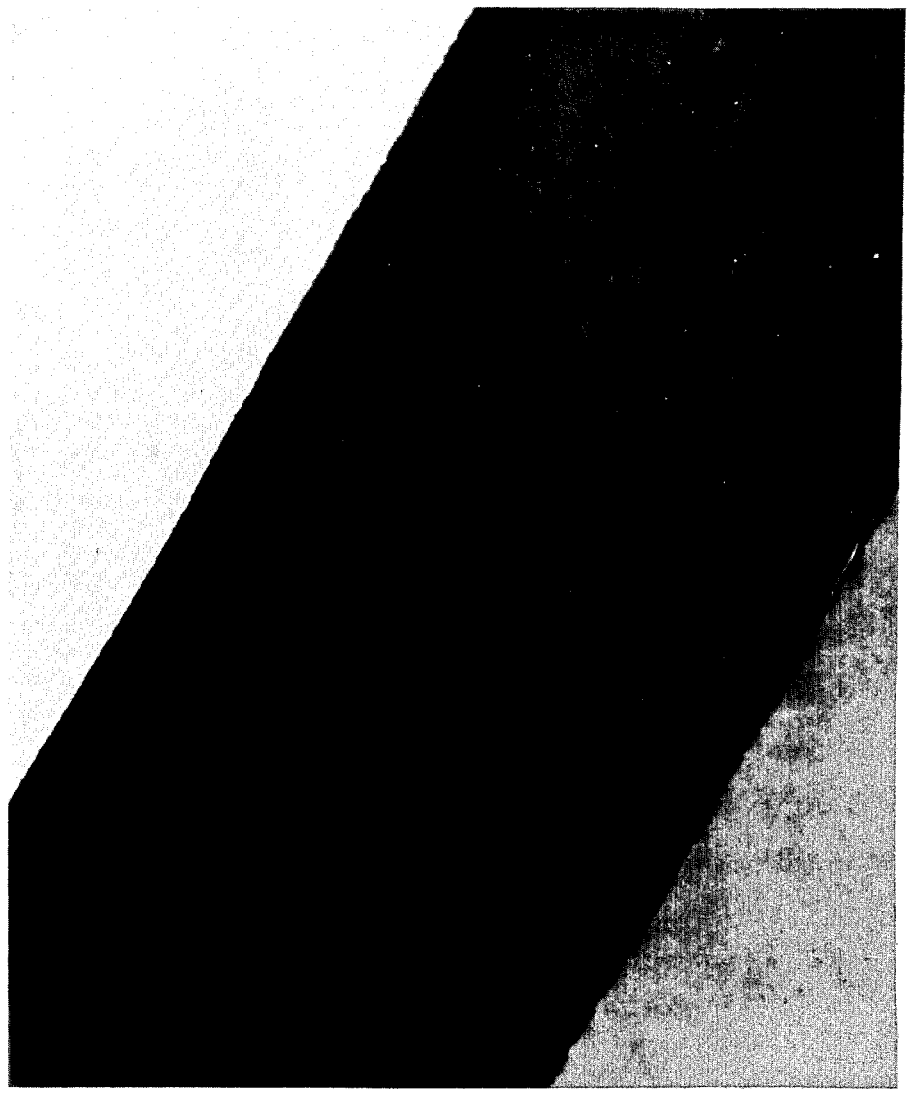

DEPOSITION OF METALS AS INTERLAYERS WITHIN ORGANIC POLYMERIC FILMS

BACKGROUND OF THE INVENTION

Field of the Invention

This invention relates to the deposition of metals as interlayers within organic polymeric films.

BACKGROUND

There exist in the art many different chemical or physical methods by which a zero-valent metal can be added to a polymeric film. Among these, some are capable of producing a thin continuous coating at a surface of the polymer, for example, metal vapor deposition or electroless plating, as disclosed by R. W. Berry, P. M. Hall, and M. T. Harris. "Thin Film Technology", D. van Nostrand Co., Inc.; Princeton, NJ, 1968, pp. 1–17. The electrical continuity and/or optical reflectivity of such a coating forms the basis for a variety of technological applications. Other processes, such as silver halide photography (A. Roff and E. Weyde, "Photographic Silver Halide Diffusion Processes", The Focal Press, London and New York, 1972, pp. 13–31) and certain forms of chemical (R. C. Haushalter and L. J. Krause, *Thin Solid Films*, 102, 161 (1983)) or electrochemical (J. A. Bruce, J. Murahashi, and M. S. Wrighton, *J. Phys. Chem.*, 86, 1552 (1982)) deposition, produce metal particles embedded within the polymer film. However, these particles are generally dispersed to such a degree that they lack the characteristic electrical or optical properties of a continuous metal layer. The present invention concerns a process capable of producing, in a single step, a thin layer of metal completely embedded within a polymer film, that is, an interlayer. By means of this process, it is possible to control both the thickness of the interlayer and its position within the polymer film. Most notably, this interlayer may possess sufficient continuity and planarity to exhibit electrical and optical characteristics hitherto available only with surface layers.

Certain organic or organometallic polymers have been described in the literature, for example, J. A. Bruce and M. S. Wrighton, *J. Am. Chem. Soc.*, 104, 74 (1982), and publications cited therein, as "electrochemically active". When coated as a film on the surface of an electrode, these polymers can accept and/or donate electrons to the electrode at a potential dictated by the redox potential of the polymer. This redox process may involve not only the surface of the polymer in contact with the electrode, but all of the redox-active groups throughout the sample. This behavior requires that both electrons and counterions have some finite mobility within the polymer.

A report by P. G. Pickup, K. M. Kuo, and R. J. Murray, *J. Electrochem. Soc.*, 130, 2205 (1983), describes their study of electrodeposition of metals (Cu, Ag, Co and Ni) from solution onto electrodes coated with the electrochemically active polymer poly-[Ru(bpy)$_2$(vpy)$_2$]$^{n+}$. At potentials sufficiently negative to reduce the polymer to Ru(I) or Ru(O) these authors report that the metal ions, for example, Cu$^{+n}$, Ag$^+$, are reduced by the polymer to form particles of films on the surface of the polymer facing the solution. They further consider the general aspects of such a process and speculate about alternative possible results from those observed. They conclude that the locus of metal deposition depends on the relative rates of the steps: (1) diffusion of metal ions through the polymer to the Pt electrode; (2) diffusion of electrons through the polymer from the Pt electrode; and (3) reduction of the metal ions by the reduced polymer. In particular, they conclude that in order to obtain metal deposition *within* the polymer, it would be necessary that steps 1 and 2 be equally fast and step 3 must be faster.

Haushalter and Krause, supra, disclose the chemical reduction of organic polymers, especially polyimides, by treatment with certain strongly-reducing main-group metal cluster compounds. Zintl ions. This process was employed for two different kinds of metallization processes. First, main group metals, derived from oxidation of the Zintl ions, were deposited on the surface of the polymer. Secondly, the reduced form of the polymer was reacted with metal salts from solution to generate zero-valent metal particles by a process which is formally equivalent to the electrochemical depositions of Bruce et al., and Pickup et al., supra. The Zintl ions were obtained either by extraction, for example, with ethylenediamine, of a Zintl phase (an alloy of a polyatomic main group element, for example, germanium, tin, lead, arsenic or antimony, with an alkali or alkaline earth metal) or by electrolysis of a main group electrode. Metallization of a polyimide of 4,4'-diaminodiphenyl ether, also referred to herein as 4,4'-oxydianiline, and pyromellitic anhydride, also referred to herein as pyromellitic dianhydride, is disclosed.

It is an object of this invention to provide a transport process by means of which metal deposition to form the interlayer is exclusively within the organic polymeric film. Another object is to provide a process by means of which the position of the interlayer in the organic polymeric film can be systematically controlled so as to be any finite distance from the surface of the polymer. Still another object is to provide a process which can be carried out under conditions in which the transport of electrons and ions are influenced by electronic field migration, and not by simple diffusion, as suggested in the art. A further object is to provide a dense, well-resolved metallic interlayer by means of a process which can be carried out under conditions which require the establishment of a steady-state, that is, a condition in which the rates of transport of ions and electrons and the rates of their reaction are all equal, in direct contradiction to that proposed in the art. Still another object is to provide a process which makes possible the deposition of a metal interlayer having sufficient density, continuity and surface regularity to exhibit electrical conductivity and optical reflectivity which are characteristic of bulk metallic phases or surface coatings. These and other objects will become apparent hereinafter.

BRIEF DESCRIPTION OF THE DRAWINGS

FIG. 6 is a plot of d/t vs. E in typical embodiments of the invention, such as represented by Examples 19 to 42.

FIG. 9 depicts a transmission electron micrograph of an electrochemically-deposited silver interlayer in a microtomed polyimide film, representative of a structure obtained by the process of the invention carried out under non-steady-state conditions.

DETAILED DESCRIPTION OF THE INVENTION

For further comprehension of the invention and of the objects and advantages thereof, reference may be made to the following description, including the examples, the accompanying drawings, and the appended claims in which the various novel features are more particularly set forth.

The invention resides in a process for metal interlayer deposition (MID); more specifically, a process by means of which a metal is deposited in its zero-valent state in a spatially-controlled manner within an organic polymeric film having first and second surfaces. More particularly, the process comprises supplying ions of the metal to at least a part of the first surface and electrons to at least a part of the second surface, said metal ions being in a positive oxidation state and in a coordination state such that they are mobile within the polymeric film and are transported through it in the general direction towards the second surface, said polymer being capable of accepting electrons in a reversible manner at the second surface, said electrons being mobile within the polymeric film and being transported through it in the general direction towards the first surface. By "reversible" is meant the capacity of the polymer to accept and donate electrons to another material or molecular entity at a finite rate without itself undergoing a change which limits this capacity. Moreover, the electrons are characterized by an electrochemical potential fixed by the reduction potential of the polymer, which potential is, in turn, negative of the reduction potential of the metal ions. The electrons can be provided: (a) by means of a cathode in an electrochemical circuit, the potential applied to the cathode being equal-to or negative-of the reduction potential of the polymer; or (b) by means of a reducing agent in solution, the oxidation potential of the reducing agent being negative with respect to the reduction potential of the polymer. The metal ions can be provided in a solution. Typical metals which can be deposited in accordance with this invention include Cu, Ag, Au, Cd, Hg, Cr, Co, Ni, Pd, Pt, Ga, In, Tl, Sn, Sb, Se and Te; preferably, the metal is Cu, Ag, Au or Hg. The organic polymers which are useful in the process of the invention include any film-forming organic polymer which is capable of transporting electrons in a reversible manner while meeting the additional polymer requirements set forth hereinafter. Such polymers include those disclosed in the art cited hereinabove, for example, polyimides, as well as certain poly-quinolines described in PCT International Publication No. WO 83/02368 and polyacetylenes, such as disclosed by C. K. Chiang, Polymer, 22, 1454 (1981) and in references cited therein.

Figure 8:
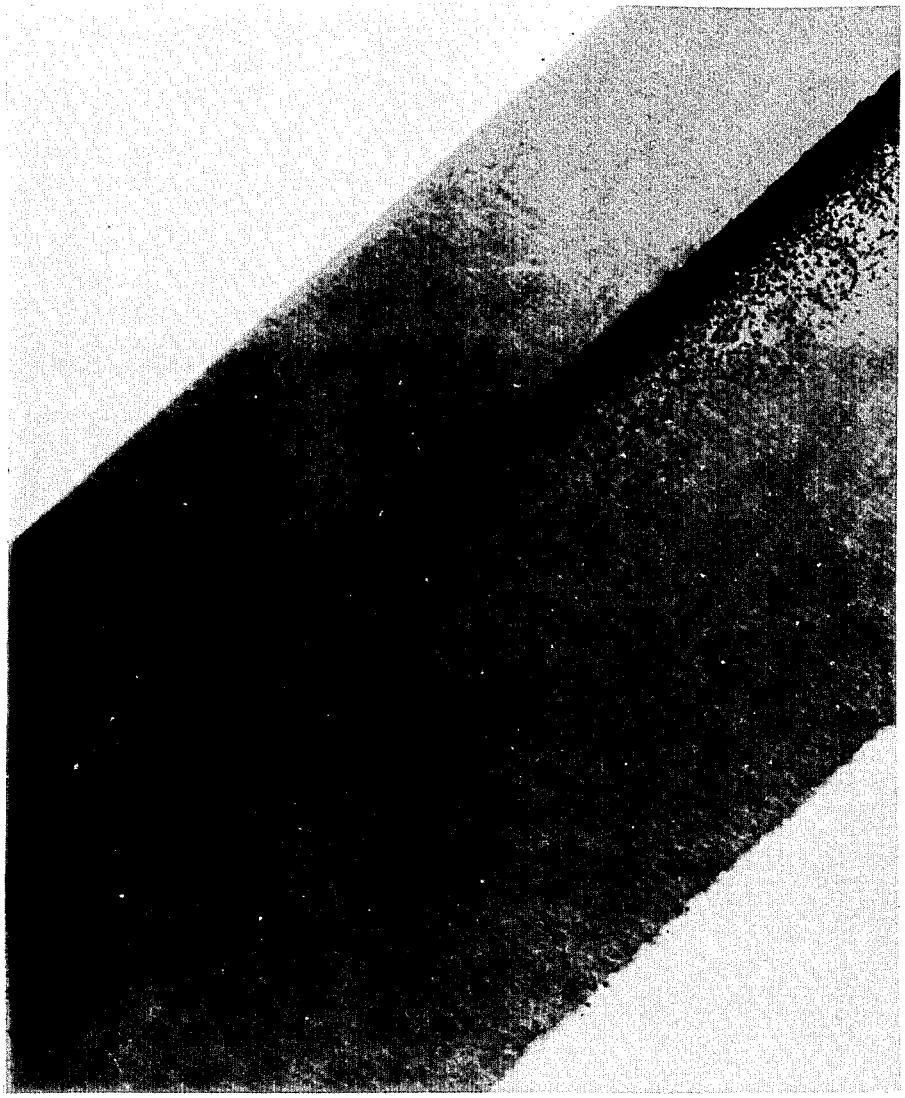
FIG. 8 depicts a transmission electron micrograph of an electrochemically-deposited silver interlayer in a microtomed polyimide film, representative of a structure obtained by the process of the invention carried out under steady-state conditions.

By "interlayer" is meant a discrete laminar region embedded within, and parallel to, the polymeric film, the laminar region being thinner in the transverse direction than said film and the density of the metal within said region being greater than the density of metal on either side of the region. By employing the principles disclosed herein, the interlayer can be produced at various distances from the surfaces of the polymer film within $\pm 1000$ A within a given experiment, or within $\pm 4,000$–$5,000$ A between experiments, such as in the various examples provided hereinafter. In preferred embodiments of the invention, the interlayer may be composed of spherical microparticles of metal having diameters no greater than 500 A, more preferably, in the range 50 to 300 A. These particles may be dispersed and disconnected within the interlayer, i.e., they may be present in the organic polymeric film in any amount greater that 0%. For most practical applications they should be present in an amount which is at least 18%, by volume. In particularly preferred embodiments of the invention the particles can be packed to a density which is as high as 75 percent of the density of the bulk metal. In a preferred embodiment the thickness of the polymeric film is 2 to 12 $\mu$m and the thickness of the interlayer is 0.05 to 1.0$\mu$ (500 to 10,000 A). In further preferred embodiments, the film is a polyimide film and the metal is silver. A representative example is illustrated by FIG. 8.

The MID process is unique in producing the laminar structure polymer/interlayer/polymer in a single step or operation. Moreover, the structure can exhibit physical characteristics which render it useful for a variety of different applications. For example, films containing interlayers composed of diffusely distributed microparticles can be optically homogeneous, i.e., the particles do not scatter light because they are much smaller than the wavelength of the light, but the optical density of the films can be very high, greater than 4.0, due to absorption of light by the metal, rendering them useful as optical filters. In another embodiment the interlayer can be prepared with a high density of metal such that the metal forms an electrically continuous phase which is capable of carrying an electrical current. The electrically-conductive interlayer can be prepared with a sharply-defined smooth interface with the surrounding polymer such that the interface is optically reflective as a mirror. The electrically-conductive, optically-reflective interlayers offer advantages over first-surface metallic coatings deposited by conventional art processes because they are resistant to abrasion, being internal to the polymer. The interlayers of the invention also offer advantages over laminated structures prepared, for example, by a stepwise procedure, because the interface between the interlayer and the polymer may be maintained optically flat and shows no tendency to delaminate. Structures produced by the MID process possess utility for reflective, electrically-conductive, abrasion-resistant coatings which may be used for electrical, optical or radiant heat shielding.

As will be apparent to one skilled in the art, metal ions can be rapidly reduced to the zero-valent state when they encounter electrons of sufficient reducing potential. The position of metal deposition is, therefore, dependent on the experimental variables which determine the fluxes of metal ions and electrons from opposing surfaces of the film. The MID process relies on control of these counter-directional fluxes. In a preferred mode of operation the fluxes of electrons and ions are both maintained constant, i.e., under steady-state conditions, during the formation of the interlayer. Depending on the experimental conditions and the properties of the polymer and the metal ions employed, different steady-state conditions may be obtained. For example, raising the concentration of metal ions in solution causes interlayer deposition to occur deeper within the film, i.e., closer to the interface with the electron source, whereas increasing the rate of delivery of electrons to the polymer film surface causes deposition to occur closer to the interface with the metal ion source. Correlations of this sort hold only within the limits of electron and ion flux dictated by the polymer itself, as discussed further herein.

In another preferred embodiment the supply of electrons and/or metal ions may be restricted to particular regions of the film's surfaces such that the interlayer is formed as a two-dimensional pattern. Any or all of the parameters discussed above can be changed during the MID process in order to obtain complex metal patterns, such as multiple layers of varying thickness, density, and position within the polymeric film. These features of the invention provide utility for the manufacture of electrically-conductive circuit patterns or metallized images.

In order to be utilized in the process of this invention, certain requirements must be fulfilled by the polymer and the metal:

1. The polymer must possess chemical functionality whose reduction potential is negative relative to the reduction potential of the metal ion. Examples of such functional groups include benzoquinone groups, aromatic nitro groups, alkyl pyridinium groups, Ru(II) tris(2,2'-bypyridine), and other similar functionality with a reduction potential more negative than $-1.0$ V versus a saturated Calomel reference electrode (SCE). Groups such as these are compatible with metals ions such as $Ag^+$, $Cu^+$, $Hg^+$, $Au^+$, and other ions whose reduction potentials are more positive than $-1.0$ V versus SCE.

2. The polymer functionality must be reversibly redox active, i.e., capable of accepting and donating electrons rapidly and without competing, irreversible chemical changes. This reversibility may require such precautions as exclusion of oxygen or potential proton donors.

3. The electrons added to the polymer at its reduction potential must be sufficiently mobile to diffuse throughout the bulk of the polymer. This mobility may occur by simple redox exchange between neighboring functional groups in different states of oxidation, "redox conduction", but it also is necessary that the polymer be permeable towards suitably charged counterions present in the external electrolyte solution in order that overall charge neutrality is maintained.

4. The polymer must be sufficiently permeable towards the metal ions so that the flux of the ions is balanced by the flux of electrons within the film. The mobility of the metal ion depends not only on its charge and size, but also on the coordination environment and state of aggregation, so that the solvent and counterions may also be important in this regard. For example, a given metal ion having a particular counterion (anion) may have insufficient mobility to be operable in the process of the invention, whereas the same metal ion (in the same oxidation or valence state) having a different counterion (anion) may have sufficient mobility and thus be operable. As an illustration, copper as $Cu^+$ in $Cu(AN)_4PF_6$ is operable in the process using an ODA/PMDA polyimide film (Example 45), whereas copper as $Cu^+$ in cuprous iodide or cuprous acetate is inoperable under the conditions of Example 45.

As with many other examples of transport phenomena, and as apparent from the above, these requisites are not solely dictated by the chemical constitution of the polymer, such as molecular structure and molecular weight, but they are also strongly influenced by its physical state, including but not limited to density, orientation, and extent of crystallinity. For example, a dense, highly crystalline polymer may have insufficient ion permeability to be operable herein, whereas an amorphous film of the same polymer may perform well. Also, since the time scale of the process is ultimately limited by the chemical stability of the reduced polymer, it may be practical to carry out the process with certain very thin polymer films, whereas the additional time required for thicker specimens of the same polymer would result in unacceptable levels of degradation. Under steady-state conditions the time required to deposit a particular thickness of interlayer increases proportionately with the thickness of the film, all other conditions being equal.

A preferred polymer for use herein is a polyimide, especially a polyimide of 4,4'-oxydianiline (ODA), also referred to as 4,4'-diaminodiphenyl ether, and pyromellitic dianhydride (PMDA), also referred to as pyromellitic anhydride. A preferred method for producing such a polyimide comprises treating the appropriate polyamic acid having an $\eta_{inh}$ of 0.40–1.7 dl/g with a 50/50, by volume, mixture of acetic anhydride and pyridine at room temperature.

In an embodiment employing an electrochemical circuit to provide the electrons, the cathode consists of an electrically-conductive substrate. The substrate can be either a homogeneous metal, semimetal, or semiconductor (stainless steel, pyrolytic carbon, or silicon, for example) or an insulating support coated with a thin layer of conductive material, such as glass coated with a thin layer of tin oxide or chromium. In the latter case, the conductive layer may cover the entire surface of the insulating support or it may consist of a two-dimensional image such as lines, separated by insulating regions.

The image represented by the conductive regions of the substrate can be reproduced by the MID process, the deposited interlayer being produced only in those regions of the polymeric film which are in contact with the conductive portions of the substrate. In a preferred embodiment of the invention an imaged substrate (chromium-on-glass) consisting of lines and spaces two microns wide was successfully reproduced by deposition of a silver interlayer in a polyimide film. Another embodiment by means of which the metal can be deposited in a patterned arrangement employs an electrically continuous cathode which is coated with the redox-active polymeric film which is, in turn, coated with an imaged mask. The image on the mask can be in the form of openings in the mask, which permits solution containing the metal ions to directly contact the redox-active layer. This mask may consist of a second polymer, for example, a photoresist material which is itself a barrier with respect to transport of the metal ions. In this embodiment the MID process proceeds only in those regions where there are openings in the mask which allow metal ions to flow.

The polymeric film in which the metal is to be deposited must be in direct contact with the cathode surface, as a film of uniform thickness, free of pinholes or other defects which would allow the electrolyte solution to contact the surface of the cathode directly. It will be understood that, to the extent the polymer must be permeable to metal ions in solution, there will be such contact with the cathode. However, in any region of the cathode which is not covered by polymer, there will be direct contact with electrolyte and this will provide a "short circuit" for the deposition process.

EVALUATING THE FEASIBILITY OF INTERLAYER DEPOSITION AND CONTROLLING THE DEPTH OF PENETRATION

To ensure that the metal is deposited as an interlayer rather than as a coating on the surface of the polymeric film, it is necessary to establish, simultaneously, fluxes of electrons and metal ions within the polymer. In general, these fluxes may either be constant in time (steady-state conditions), or they may vary with time (non-steady state).

As will be demonstrated by examples which follow, steady-state conditions are of special importance. First, because simple measurements of Faradaic current under steady-state conditions provide a means for evaluating the feasibility of interlayer deposition for any given choice of polymer, metal salt, and set of experimental conditions. The results of such measurements can then be used to predict and control the position (penetration depth) of the interlayer within the polymer. Secondly, steady-state conditions are optimum for producing an interlayer with the maximum density of metal and the narrowest distribution of metal throughout the film.

Following is a phenomenological description of the steady-state. The principal assumptions are: (1) that the reduction potential of the polymer is negative of the reduction potential of the metal ion; and (2) that reaction between metal ions and electrons occurs upon encounter, i.e., the reaction rate is transport limited.

Figure 1:
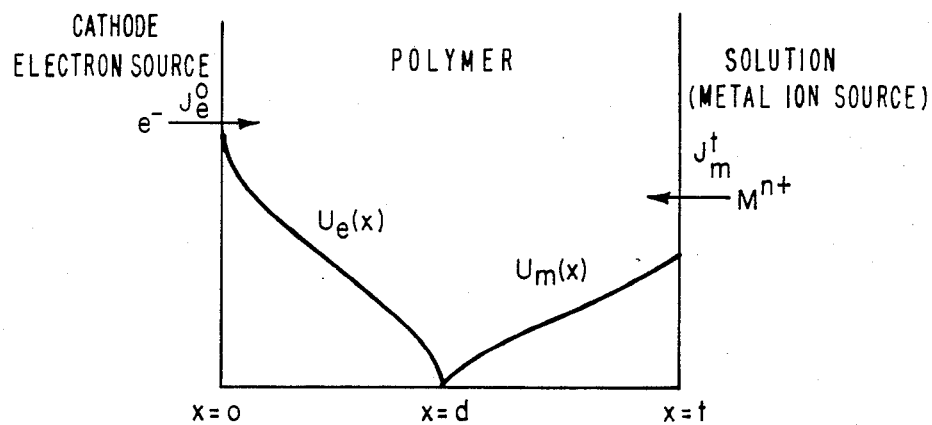
FIG. 1 is a schematic representation showing the electrochemical potential for ions and electrons as a function of the distance across a polymer film.

FIG. 1 is a schematic diagram of fluxes under steady-state conditions, wherein $U_e(x)$ and $U_m(x)$ on the vertical axis are position-dependent electrochemical potentials for the electrons and metal ions, respectively, as functions of the transverse distance across the polymeric film on the horizontal axis x. At x=0 the polymeric film is in contact with the cathode; at x=t the polymeric film is in contact with metal ions $M^{n+}$ in solution; and x=d is the locus of deposition of the interlayer within the polymeric film at steady-state conditions.

At steady-state, electron flux across the cathode interface, $J_e^o$ must be exactly balanced by metal ion flux across the solution interface, $J_m^t$. If this condition is not satisfied, then one of the two species accumulates in the polymer. These fluxes are also related to the steady-state current density (I):

$$\frac{I}{F} = J_e^o = nJ_m^t \tag{1}$$

wherein F is Faraday's constant, n is the valence of the metal ion, and the superscripts o and t denote the positions along the x-axis. The two fluxes are each related to the mobilities and concentrations of the two species at the respective interfaces and to the gradient of electrochemical potential that they experience:

$$J_e^o = \mu_e [P^-]^o \left[\frac{dU_e}{dx}\right]^o \tag{2}$$

$$J_m^t = \mu_m K_s [M^{n+}] \left[\frac{dU_m}{dx}\right]^t \tag{3}$$

wherein $[P^-]^o$ is the concentration of reduced polymer functional groups at the cathode interface, $[M^{n+}]$ is the solution concentration of metal ions and $K_s$ is the partition coefficient for sorption of these ions by the polymer. The latter will depend on the characteristics of the counterions as well. $[P^-]^o$ can be related to the applied potential, E, and the standard half-cell potential for the polymer, $E^o$, according to the Nernst equation:

$$[P^-]^o = \frac{[P] \exp\left(\frac{nF}{RT}(E^o - E)\right)}{1 + \exp\left(\frac{nF}{RT}(E^o - E)\right)}$$

wherein [P] is the total concentration of redox-active functional groups in the polymer.

In the event that charge density variations within the film are small and, consequently, electric field migration can be neglected, then transport will be governed by diffusion alone. Moreover, if the diffusion coefficients for electrons, $D_e$, and metal ions, $D_m$, are independent of concentration, then equations (2) and (3) can be simplified to:

$$J_e^o = \frac{D_e(P^-)^o}{d} \tag{5}$$

$$J_m^t = \frac{D_m K_s [M^{n+}]}{t - d} \tag{6}$$

or, with equation (1):

$$\frac{d}{t} = 1 + \frac{D_e[P^-]^o}{nD_m K_s[M^{n+}]} \tag{7}$$

These correlations are expected to hold only under conditions where the mobility and/or the concentration of electrolyte ions are high relative to $M^{n+}$. Thus, equation (7) was found to give a good representation for the embodiment in which the polymer is polyimide (ODA/PMDA), the metal ion is $Ag^+$ and the electrolyte is tetramethylammonium hexafluorophosphate (TMAPF$_6$) only when the concentration of electrolyte exceeded that of the $Ag^+$ salt by five-fold or more.

In general, the potential gradients are complex functions, involving both concentration gradients (diffusion) and electric field gradients (migration). Consequently, the gradients may not be strictly linear with respect to x, and they will be dependent on the concentrations, mobilities and sorption coefficients of all other ions in the system.

Such complications prohibit a general analytical solution to the transport equations. However, an empirical correlation exists which relates variations in the current density, I, with the position of the interlayer, d. The correlation involves maintaining the composition at one interface constant, either $[P^-]^o$ or $[M^{n+}]^i$, while systematically varying the composition at the other interface, $[M^{n+}]^i$ or $[P^-]^o$, respectively, and observing the resulting variations in steady-state current density, I. The first experiment is carried out while holding E at a value intermediate between the reduction potential of the polymer and the reduction potential of the metal ions. If the polymer is permeable towards the metal ions, there may be observed a steady-state current corresponding to deposition of the metal at the interface between the cathode and the polymer. This can be referred to as the "solution limited" current density, $I_s$, because its magnitude is determined by the composition at the polymer/solution interface. $I_s$ may not be strictly proportional to $[M^{n+}]^i$ but will always vary directly with it. Next, the solution composition is held constant and the applied potential is adjusted to a value more negative than the reduction potential of the polymer. If the polymer is capable of supporting an electron flux equal in magnitude to the metal ion flux, then the steady-state current measured under these conditions will exceed the value of $I_s$ determined for the same polymer film with the same solution composition.

The empirical tests described above allow one skilled in the art to determine whether the MID process will be feasible for any given combination of polymer, metal salt, solution composition, and applied potential. In fact, for I greater than $I_s$, it was discovered that the ratio $I_s/I$ relates directly to the position of the deposited interlayer according to the empirical equation:

$$1 - d/t = I_s/I + \text{constant} \qquad (8).$$

In the examples which follow will be illustrated various conditions used to prepare polymer-coated cathodes, conditions employed for growing an interlayer under steady-state conditions, analysis and characterization of the interlayer, and correlations of the position of the interlayer with the experimental parameters as described above.

In carrying out the process of the invention under steady-state conditions, the fluxes of metal ions and electrons are maintained constant during a substantial period of the process so as to generate an interlayer with the maximum achievable density of metal particles.

In carrying out the process of the invention under non-steady-state conditions, the fluxes of metal ions and electrons are varied systematically during a substantial period of the process so as to generate an interlayer of controlled density, lower than the maximum achievable density.

EXAMPLE 1

A. Polymer Film and Film-Coated Electrode

Polyamic acid having an $\eta_{inh}$ of 1.48 dl/g (average of $\eta_{inh}$ ranging from 1.3 to 1.7) was prepared from 4,4'-oxydianiline and pyromellitic dianhydride. A 12 wt. % solution of the polyamic acid in dry N,N-dimethylacetamide (DMAc) was filtered through a Millipore ® (10.0 μm pore) filter. A clean, $SnO_2$-coated glass plate was spin-coated with this solution using a Headway Research Inc. Model EC101D Photoresist Spinner at 1000 rpm. The plate was transferred to a hot plate at 80° C. for a period of 10 minutes until the polymer formed a clear, colorless solid film.

The film was converted to the polyimide structure by immersing the plate in a mixture of acetic anhydride and pyridine (equal parts by volume) for a period of two h at room temperature, by which time it acquired the typical yellow gold color of the polyimide but remained clear and adherent. The film was rinsed thoroughly with methanol and then air dried. Conversion to polyimide was confirmed by infrared analysis. The film thickness was determined using transmission electron microscopy (TEM) of microtomed cross-sections and found to be 2.17 μm.

B. Electrochemical Cell and Experimental Conditions

The metal ion deposition process can be carried out with either controlled potential or controlled current. The former requires a conventional three-electrode configuration and potentiostat; the latter does not require a reference electrode.

Figure 2:
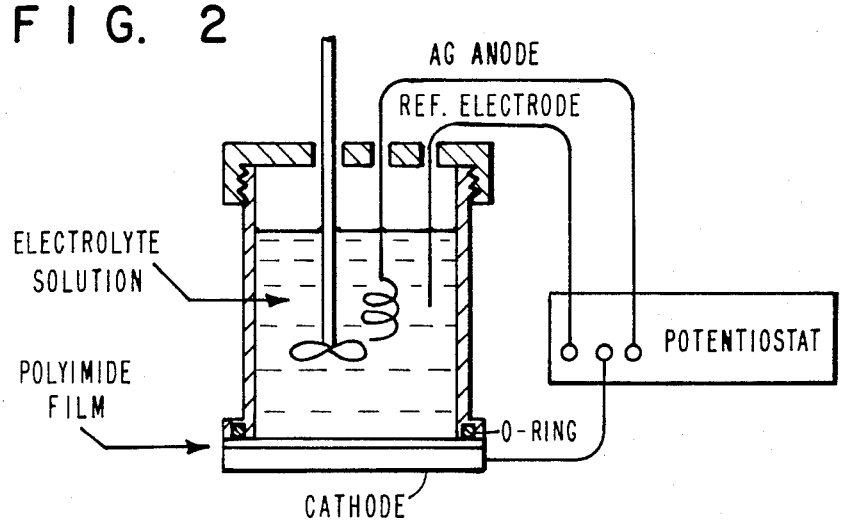
FIG. 2 is a schematic representation of the apparatus used to carry out the process of the invention employing an electrochemical cell to provide electrons.

FIG. 2 depicts a typical apparatus for the electrochemical deposition of a silver interlayer in a polyimide film by means of the process of the invention. The cell consists of a Pyrex ® cylinder sealed to the surface of the polymer-coated cathode by means of an O-ring and clamp (not shown). The counter electrode and reference electrode are both silver wires and they are connected along with the cathode to a potentiostat (Princeton Applied Research Model 173). During operation, the electrolyte solution is stirred and purged with a stream of nitrogen (not shown). The components and their functions are as follows:

(1) The electrolyte, 0.10M tetramethylammonium hexafluorophosphate (TMAPF$_6$) in N,N-dimethylformamide (DMF) in which was dissolved AgBF$_4$ at a concentration of 0.010M, carries current and minimizes voltage drops across the solution and polymer film due to their high resistance and minimizes the influence of migration on the transport of Ag$^+$.

(2) The silver anode maintains a constant concentration of Ag$^+$ in solution. As Ag$^+$ is electrodeposited into the film, fresh ions are produced at the anode at a stoichiometrically equal rate.

(3) The potentiostat (PAR model 173) controls the potential difference between the cathode and the reference electrode at a predetermined value (−1.30 volts in this example) and provides the required current between cathode and anode.

(4) The cathode consists of $SnO_2$-coated glass plate having a spin-coated polyimide film which is similar to that prepared in Part A except that it is of 6 μm thickness, having been prepared from a 15 wt. % solution of polyamic acid in DMAc. A circular disc of area 7.07 cm$^2$ is exposed to the electrolyte and sealed by means of an O-ring to the bottom of the cell.

(5) The stirrer maintains homogeneity of the electrolyte, preventing polarization of the Ag$^+$ concentration.

(6) A nitrogen bubbler (not shown) maintains a continuous flow of nitrogen through the solution to preclude gradual air oxidation of the reduced polyimide.

Figure 3:
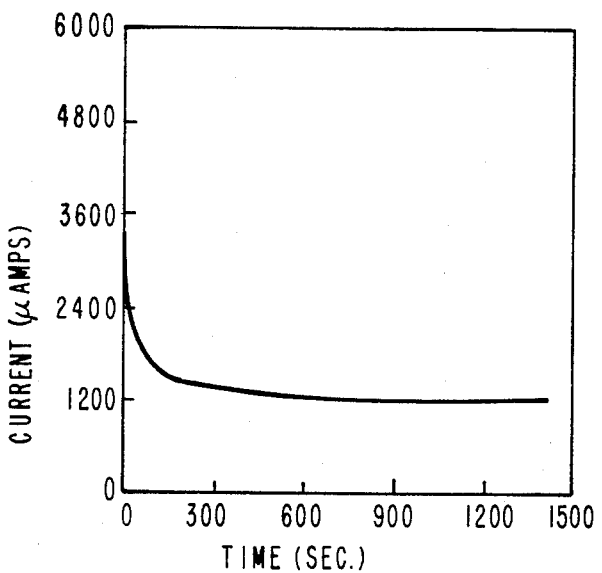
FIG. 3 is a plot of time vs. current in a typical embodiment of the invention, such as that carried out in the apparatus of FIG. 2.

The experiment was begun by adjusting the potential from +0.30 V (vs. an Ag wire reference electrode) to −1.30 V. The current measured as a function of time is shown in FIG. 3. The experiment was terminated by opening the circuit when the total amount of charge passed reached 2.0 coulombs.

The polymer film was then washed thoroughly with methanol. In appearance it was a bright gold-colored mirror when viewed from the side originally exposed to the solution and dark black when viewed through the glass cathode. The film was removed intact from the cathode by peeling it carefully away while immersed in aqueous methanol. It was allowed to dry at room temperature.

A small portion of the film was cut out, potted in an epoxy resin, and microtomed in cross section. High resolution transmission electron microscopy (TEM) micrographs were recorded. Prior to potting, a thin, ca. 400 A, layer of Au/Pd was sputtered onto the cathode side of the film in order to recognize its orientation in the micrograph.

A dark band of dense silver microparticles appeared in the center of the film. Silver was identified by energy dispersive X-ray analysis (EDAX) and electron diffraction.

Control of Interlayer Dimensions

The thickness of the metal interlayer formed under steady-state deposition conditions is proportional to the quantity of metal incorporated for a fixed surface area of polymer film. As judged by TEM of microtomed thin sections, an interlayer of 500 A to 10,000 A can be produced within a precision of ±250 A.

EXAMPLES 2-10

Figure 4:
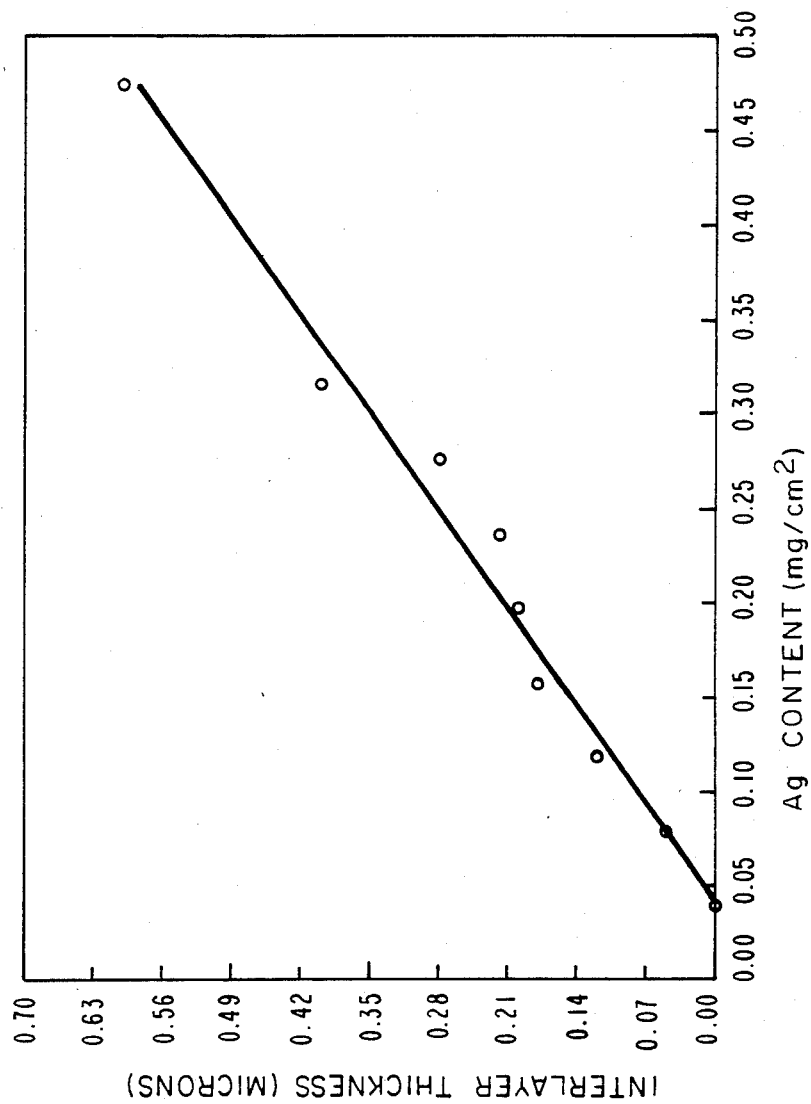
FIG. 4 is a plot of interlayer thickness vs. silver content for Examples 2 to 10.

Nine polymer-coated cathodes were prepared and each was subjected to identical deposition conditions as in Example 1. The quantity of silver was controlled by opening the circuit after the desired amount of charge had been passed. The products were recovered and analyzed by TEM. Table 1 summarizes the results and FIG. 4 shows the dependence of Ag interlayer thickness on the total AG content of the sample. Silver contents were determine A linear least squares best fit to the data (correlation coefficient 0.990) indicates that the silver interlayer is first established after approximately 0.04 mg/cm$^2$ of deposition. This corresponds to the establishment of steady-state conditions as indicated, for example, by constancy of the current (FIG. 3). The linear dependence of $t_{Ag}$ on Ag content demonstrates that, once formed, the interlayer grows in thickness at constant density. The density, calculated from the slope of the line, is 7.45 g Ag/cm$^3$, 71% of that for pure Ag.

From a high magnification TEM image of the interlayer in Example 9, it was observed that the Ag occurred as almost spherical particles, with diameters ranging from 50 to 300 A. The particles were distributed in a diffuse region on the side of the interlayer toward the cathode and formed a dense connected network in the interlayer. The diffuse particles were formed at an early stage of the deposition, prior to establishment of steady-state. Under these conditions, the first wave of electrons flowing away from the cathode interface encounter Ag$^+$ ions which were already absorbed by the polymer prior to the beginning of electrolysis.

TABLE 1

| Ex No. | Ag Content (mg Ag/cm$^2$) | dc$^{(1)}$ | ds$^{(2)}$ | $t_{Ag}^{(3)}$ |
| --- | --- | --- | --- | --- |
| 2 | 0.0395 | 3.5 | 2.1 | 0.00 |
| 3 | 0.079 | 3.7 | 2.7 | 0.05 |
| 4 | 0.119 | 3.3 | 2.2 | 0.12 |
| 5 | 0.158 | 3.2 | 2.2 | 0.18 |
| 6 | 0.198 | — | — | 0.20 |
| 7 | 0.237 | 3.9 | 2.0 | 0.22 |

TABLE 1-continued

| Ex No. | Ag Content (mg Ag/cm$^2$) | dc$^{(1)}$ | ds$^{(2)}$ | $t_{Ag}^{(3)}$ |
| --- | --- | --- | --- | --- |
| 8 | 0.277 | 3.7 | 2.0 | 0.28 |
| 9 | 0.316 | 3.4 | 2.1 | 0.40 |
| 10 | 0.474 | 2.5 | 2.4 | 0.60 |

$^{(1)}$dc — distance of interlayer from cathode (μm)
$^{(2)}$ds — distance of interlayer from solution (μm)
$^{(3)}$$t_{Ag}$ — thickness of interlayer (μm)
Utility

EXAMPLES 11-16

Figure 5:
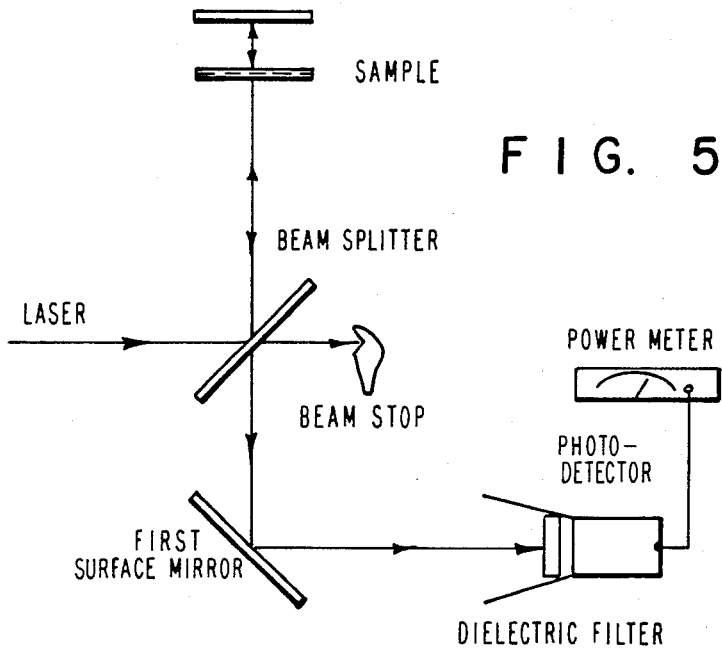
FIG. 5 is a schematic representation of a typical apparatus used to measure the reflectivities of the interlayers produced by means of the process of the invention, such as in Examples 11 to 16.

As noted in Example 1, the process of the invention can be used to prepare mirrors. A number of mirrors were so prepared and their reflectivities were measured using a He—Ne, 5 mW, λ=6328 A laser in the configuration shown in FIG. 5. The reference mirror is a first surface mirror coated with a 3 μm ODA/PMDA polyimide film. The sample is a layer of silver electrodeposited into ODA/PMDA polyimide film. This choice of reference compensates for absorptive and scattering corrections which are introduced into the experiment by the polymer film. The intensity of light reflected by the sample is measured at its optimum orientation with respect to the laser beam and this is compared directly with the reading obtained from a reference first-surface mirror overcoated with polymer, located in a fixed position directly behind the sample holder. Thus, the ratio of the photosignal with the sample in the lower arm of the reflectometer to that reflected from the reference mirror yields reflectivity R of the silver layer. Table 2 shows reflectivities (R, in %) for samples with different silver loadings. The conductivity $\sigma$ was estimated from the reflectivity R at the laser frequency $\nu$ and is shown in the table.

$$R = \frac{2(\sigma/\nu) + 1 - 2\sqrt{\sigma/\nu}}{2(\sigma/\nu) + 1 + 2\sqrt{\sigma/\nu}}$$

TABLE 2

| Ex. No. | Ag Content (mg/cm$^2$) | R (%) | $\sigma(\Omega^{-1}cm^{-1})$ |
| --- | --- | --- | --- |
| 11 | 0.079 | 6 | <10$^2$ |
| 12 | 0.111 | 19 | 4.8 × 10$^2$ |
| 13 | 0.127 | 20 | 5.3 × 10$^2$ |
| 14 | 0.143 | 25 | 8.9 × 10$^2$ |
| 15 | 0.158 | 34 | 1.6 × 10$^3$ |
| 16 | 0.190 | 36 | 1.8 × 10$^3$ |

EXAMPLES 17-18

Measurement of Sheet Resistance and TCR for Silver in ODA/PMDA Films

The sheet resistance was measured using the "four-point probe" technique of Berry, Hall and Harris, supra. In this method, four contacts are made to the film; current is injected across the outer pair of contacts, and the resultant voltage drop across the two remaining points is measured. The sheet resistance ($R_s$) of a layer of thickness $t_{Ag}$ is proportional to the ratio of the voltage (V) to the current (I).

$$R_s = C\frac{(V)}{I} = (\sigma t_{Ag})^{-1}$$

For samples such as those described in the previous examples, the conductive interlayer resides beneath the external surfaces of the polymer. Consequently, only very high resistances were measured for contacts placed on these surfaces. Electrical characterizations of the interlayers per se were made by creating holes in the film at the desired contact positions and filling these holes with solder or conductive paste. The constant C was measured using thin sputtered gold layers of known specific conductivity and thickness d. The temperature coefficient of resistance (TCR) is defined as (1/R) (dR/dT). For films thicker than a few hundred angstroms, dR/dT is essentially independent of temperature and $$TCR = \frac{1}{R_{rt}} \frac{(R_1 - R_{rt})}{(T_1 - T_{rt})}$$

wherein $R_{rt}$ is the resistance at room temperature ($T_{rt}$), and $R_1$ is the resistance at some other temperature ($T_1$). The measurements herein were carried out between liquid nitrogen temperature ($-196°$ C.) and $22°$ C. The specific conductivity and TCR values of the interlayers are tabulated in Table 3.

TABLE 3

| Ex. No. | $t_{Ag}$ (Å) Thickness of the Dense Interlayer of Silver | $\sigma(\Omega^{-1}cm^{-1})$ R. T. Specific Conductivity | TCR (°K.$^{-1}$) Temperature Coefficient of Resistance |
|---|---|---|---|
| 17 | 1875 | $6.5 \times 10^2$ | $4.2 \times 10^{-4}$ |
| 18 | 9000 | $1.7 \times 10^3$ | $6.2 \times 10^{-4}$ |
| Silver Metal | | $6.8 \times 10^5$ | $4.1 \times 10^{-3}$ |

EXAMPLES 19–42

Regulation of Interlayer Position (Penetration Depth)

Using the same experimental system described in Example 1, a series of Ag interlayers was prepared in ODA/PMDA polyimide films using various combinations of Ag$^+$ concentration and applied potential. In certain cases, $I_s$ was first determined at a potential of either $-0.70$ V or $-0.30$ V vs. Ag/Ag$^+$. The data are summarized in Table 4. The values of the polymer film thickness, t, and the penetration depth, d, were measured either by TEM of microtomed cross-sections or by the following combination of measurements: A measure of t was made using a mechanical profilometer (Sloan-Technology Dektak model IIa). A reflectance IR spectrum was then obtained (Varian model 2390) from the solution side of the specimen. The sinusoidal interference fringes observed were used to calculate the distance t-d from the front surface of the film to the reflective surface of the interlayer. These results were found to be in good agreement with TEM measurements.

Figure 7:
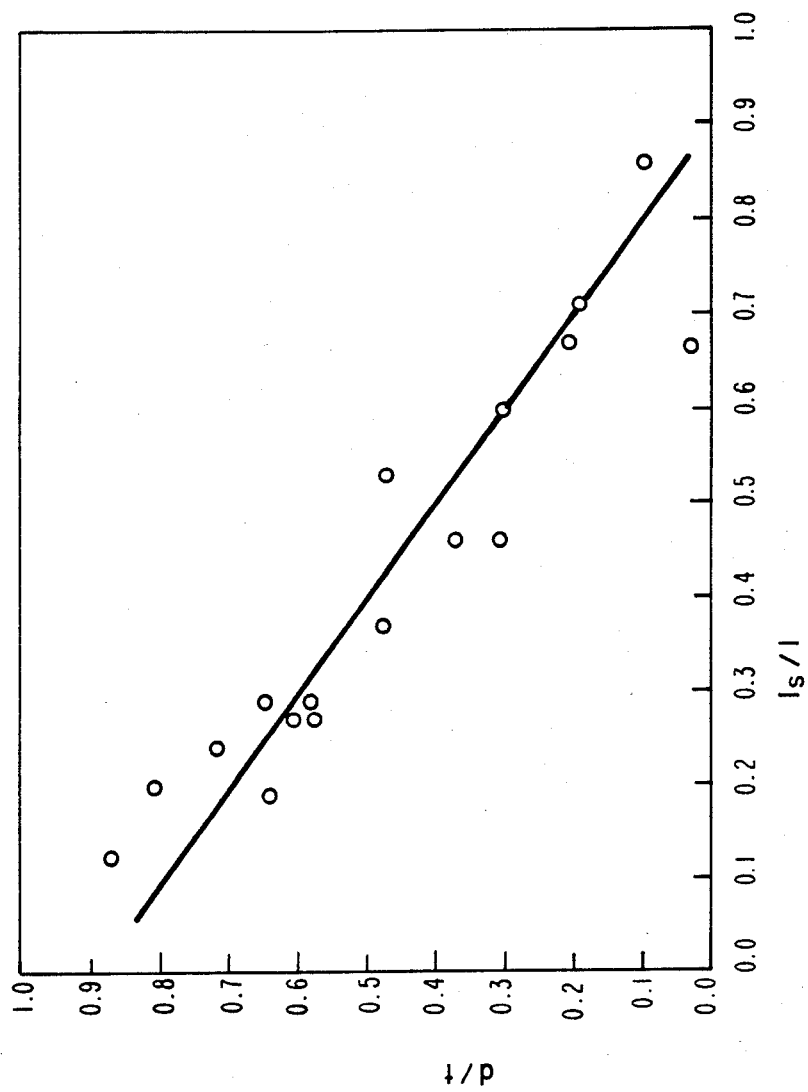
FIG. 7 is a plot of d/t vs. $I_s/I$ in typical embodiments of the invention, such as represented by Examples 19 to 42.

The results are also plotted in FIGS. 6 and 7 in accordance with the analysis of the steady-state presented above. In each instance the experimental data are represented by points and the lines correspond to a best fit of the theoretical equations (equations 7 and 8) using a single choice of parameters. It will be noted that for Ag$^+$ concentrations less than 0.02M, the simple diffusion model appears to be well obeyed. The more general correlation of d/t with $I_s/I$ appears to be valid for all of the conditions investigated. More specifically regarding FIG. 6, the experimental points were obtained for Ag$^+$ concentrations of 0.010M (circles) and 0.002M (triangles), as reported in Table 4. The lines were calculated from equations 7 and 4 wherein $D_e = 8 \times 10^{-9}$ cm$^2$/sec, $D_m K_s = 1.7 \times 10^{-7}$ cm$^2$/sec, $[P^-]° = 3.67M$, and $E° = -1.25$ V vs. Ag/Ag$^+$. Regarding FIG. 7, the experimental data (Table 4) represent a range of conditions (applied potential and Ag$^+$ concentration). In each case $I_s$ was determined at a potential between $-0.30$ and $-0.70$ V vs. Ag/Ag$^+$. The line corresponds to equation 8.

TABLE 4

| Ex. No. | [Ag+] (mole/l) | E (V vs. Ag/Ag+) | $I_s$ (mA/cm$^2$) | I | t (microns) | d | $I_s/I$ | d/t |
|---|---|---|---|---|---|---|---|---|
| 19 | .020 | −1.30 | .047 | .079 | 11.2 | 3.5 | .60 | .31 |
| 20 | .030 | −1.30 | .087 | .122 | 10.95 | 2.08 | .71 | .19 |
| 21 | .050 | −1.30 | .142 | .165 | 11.0 | 0.96 | .86 | .09 |
| 22 | .006 | −1.30 | .024 | .100 | 7.45 | 5.36 | .24 | .72 |
| 23 | .004 | −1.30 | .018 | .090 | 8.07 | 6.5 | .20 | .81 |
| 24 | .002 | −1.30 | .010 | .083 | 8.09 | 7.0 | .12 | .87 |
| 25 | .010 | −1.35 | .027 | .100 | 9.5 | 5.46 | .27 | .57 |
|   |   |   |   |   | 8.92 | 5.33 |   | .60 |
| 26 | 9.4 | −1.25 | .026 | .071 | 9.3 | 4.5 | .37 | .48 |
| 27 | .010 | −1.20 | .025 | .055 | 8.3 | 2.53 | .46 | .30 |
|   |   |   |   |   | 8.58 | 3.17 |   | .37 |
| 28 | .010 | −1.40 | .028 | .097 | 10.5 | 6.7 | .29 | .64 |
| 29 | .002 | −1.20 | .0099 | .052 | 8.64 | 5.5 | .19 | .64 |
| 30 | .002 | −1.15 | .0099 | .034 | 8.76 | 6.6 | .29 | .58 |
| 31 | .002 | −1.10 | .0113 | .024 | 7.94 | 3.7 | .53 | .47 |
| 32 | .002 | −1.05 | .0113 | .017 | 7.55 | 1.5 | .67 | .20 |
| 33 | .002 | −1.00 | .0071 | .0105 | 8.25 | 0.1 | .67 | .01 |
| 34 | .010 | −0.60 | — | — | 7.3 | 0.22 | — | .03 |
| 35 | .010 | −1.30 | — | — | 8.8 | 5.2 | — | .59 |
| 36 | .010 | −1.00 | — | — | 7.2 | 0.30 | — | .04 |
| 37 | .010 | −1.20 | — | — | 8.3 | 4.2 | — | .50 |
| 38 | .010 | −1.40 | — | — | 8.9 | 5.1 | — | .57 |
| 39 | .010 | −1.10 | — | — | 9.2 | 0.4 | — | .04 |
| 40 | .010 | −1.15 | — | — | 9.4 | 0.5 | — | .05 |
| 41 | .010 | −1.25 | — | — | 9.5 | 4.1 | — | .43 |
| 42 | .010 | −1.30 | — | — | 9.1 | 4.8 | — | .51 |

FIG. 8 is a photomicrograph of a typical silver interlayer deposited in a polyimide film by means of the process of the invention, the film being microtomed in cross section and viewed in transmission. The reference marker represents 1μ (10,000 Å). Thus, the silver interlayer thickness is approximately 3,800 Å and the film thickness is approximately 92,000 Å. Adjacent the interlayer are isolated silver particles. While carrying out the process of the invention the lower right surface of the film was on the cathode, the upper left surface was in contact with the metal ion source.

EXAMPLE 43

Interlayer from Imaged Cathode

A polymer-coated cathode was prepared by the procedure described in Example 1 using as the cathode a chromium-on-glass commercial photomask (Photographic Sciences Corp., USAF 1951 test chart, MT-14). This mask includes bars and spaces in a chromium layer where the minimum features are 2.2 microns wide. Metal interlayer deposition was carried out with 0.01M AgBF$_4$ in DMF without electrolyte. The current was maintained at 0.11 mA/cm$^2$ until 0.21 coulomb/cm$^2$ had been deposited. The current was turned off, the film was washed with methanol and removed from the surface of the cathode. The pattern of the original cathode was reproduced as a silver mirror within the polymer film. In particular, the 2.2 micron bars and spaces were reproduced in the interlayer. The original chromium image was in no way affected by the process and could be used again to repeat the process with a new polymeric film.

EXAMPLE 44

Interlayer Formed Using a Photoresist Mask

A glass plate coated with $SnO_2$ was employed as the cathode and was prepared as described in Example 1. After the polyimide had been cured as described in Example 1, a photoresist layer (KTI negative resist) was spin coated on top of the polyimide at 2000 rpm. This layer was cured at 90° C. for 10 minutes and then exposed under a test image photomask comprising bars and lines. The photoresist was developed by employing conditions recommended by the manufacturer. A silver interlayer was deposited using a solution 0.10M in $TMAPF_6$, 0.01M in $AgBF_4$ and a constant potential of $-1.30$ V vs. $Ag/Ag^+$. The silver interlayer became visible and developed only in those regions of the sample where development had removed the photoresist from the surface. The process was stopped after 0.07 coulomb/cm² had been deposited; the sample was washed with methanol and inspected under an optical microscope. The interlayer appeared as a reflective image which faithfully reproduced the image recorded in the photoresist mask.

EXAMPLE 45

Deposition of a Copper Interlayer

A copper interlayer was deposited into a film of ODA/PMDA polyimide coated onto a glass cathode coated with $SnO_2$, prepared as in Example 1. Deposition was carried out using 0.10M $TMAPF_6$ and 0.02M $Cu(AN)_4PF_6$ in DMF, wherein AN is acetonitrile. The potential was maintained at $-1.30$ V vs. $Ag/Ag^+$ and 0.18 coulomb/cm² was deposited. The film was washed with methanol, removed from the cathode and examined as a microtomed cross-section by TEM. The copper metal was observed as polyhedral particles, roughly 500 A in diameter, in a tightly distributed band 0.4 micron wide at a depth d/t of 0.85.

EXAMPLE 46

Interlayers of Diminished Metal Density from Non-Steady-State Conditions

A polyimide-coated, $SnO_2$-coated glass cathode was prepared as in Example 1. The cathode was mounted in the cell which was filled with 0.10M $TMAPF_6$ and 0.002M $AgBF_4$ in DMF. Deposition was carried out employing an applied potential which was continuously varied between $-0.90$ and $-1.30$ V vs. $Ag/Ag^+$. The potential was programmed in a "saw tooth" manner, i.e., it was changed linearly with time between the two limits at a rate of 10 mV per second. Deposition was continued until the total silver content reached 0.16 mg/cm².

The product differed from those prepared under steady-state conditions at comparable silver content in that it exhibited no metallic reflectivity viewed from either direction. FIG. 9 shows a transmission electron micrograph prepared from this product microtomed in cross-section. It is apparent that the silver microparticles are distributed as a broad interlayer approximately 1μ in thickness, corresponding to a volume fraction of silver of 18%, about one-fourth that obtained under steady-state conditions. In FIG. 9, the scale bar at the bottom represents 1.0μ. The polymer film, 7.8μ thick, is seen with the original cathode interface on the upper left and the original metal ion solution interface on the lower right. The dark line at the solution interface is a Au/Pd film applied evaporatively prior to microtoming the sample.

BEST MODE FOR CARRYING OUT THE INVENTION

The best mode presently contemplated for carrying out the invention is illustrated by Example 1.

Although preferred embodiments of the invention have been illustrated and described, it is to be understood that there is no intent to limit the invention to the precise constructions herein disclosed, and it is to be further understood that the right is reserved to all changes and modifications coming within the scope of the invention as defined in the appended claims.

I claim:

1. Metal interlayer deposition process by means of which a metal is deposited in its zero-valent state in a spatially-controlled manner within an organic polymeric film having first and second surfaces, the process comprising supplying ions of the metal to at least a part of the first surface and electrons to at least a part of the second surface, the metal ions being in a positive oxidation state and in a coordination state such that they are mobile within the polymeric film and are transported through the film in a general direction toward the second surface, the polymeric film being capable of accepting electrons in a reversible manner at the second surface, and the electrons being mobile within the polymeric film and being transported through the film in a general direction toward the first surface.

2. Process of claim 1 wherein the electrons are provided by the cathode in an electrochemical circuit, the potential applied to the cathode being equal to or negative of the reduction potential of the polymer.

3. Process of claim 1 wherein the electrons are provided by a reducing agent in solution, the oxidation potential of the reducing agent being negative with respect to the reduction potential of the polymer.

4. Process of claim 1 wherein the metal is deposited as spherical particles having diameters no greater than 500 A.

5. Process of claim 1 wherein the metal is deposited as spherical particles having diameters within the range 50–300 A.

6. Process of claim 1 wherein the metal is deposited as a continuous layer having a thickness of 500 A to 10,000 A.

7. Process of claim 5 wherein the polymeric film has a thickness within the range 2–12 μm.

8. Process of claim 1 wherein the metal ions are provided in solution and the metal is selected from Cu, Ag, Au, Cd, Hg, Cr, Co, Ni, Pd, Pt and Sn.

9. Process of claim 7 wherein the metal is Ag and the polymeric film is comprised of a polyimide.

10. Process of claim 7 wherein the metal is Cu and the polymeric film is comprised of a polyimide.

11. Process of claim 7 wherein the metal is Au and the polymeric film is comprised of a polyimide.

12. Process of claim 7 wherein the metal is Hg and the polymeric film is comprised of a polyimide.

13. Process of claim 2 wherein the cathode comprises an electrically-conductive two-dimensional pattern separated by insulating regions, and the deposited metal corresponds to the two-dimensional pattern.

14. Process of claim 2 wherein the organic polymer film is laminated with an electrically insulative film having patterned openings through which the ions of the metal flow.

15. Process of claim 1 wherein the fluxes of metal ions and electrons are maintained constant during a substantial period of the process so as to generate an interlayer with the maximum achievable density of metal particles.

16. Process of claim 1 wherein the fluxes of metal ions and electrons are varied systematically during a substantial period of the process so as to generate an interlayer of controlled density, lower than the maximum achievable density.

17. Process of claim 9 wherein the polymeric film is comprised of a polyimide of 4,4'-oxydianiline and pyromellitic dianhydride.

18. Process of claim 10 wherein the polymeric film is comprised of a polyimide of 4,4'-oxydianiline and pyromellitic dianhydride.

19. Process of claim 11 wherein the polymeric film is comprised of a polyimide of 4,4'-oxydianiline and pyromellitic dianhydride.

20. Process of claim 12 wherein the polymeric film is comprised of a polyimide of 4,4'-oxydianiline and pyromellitic dianhydride.

21. Film structure comprising an organic polymeric film within which is a metal interlayer which has been formed without any substantial change in the discrete dimensions of the film.

22. Film structure of claim 21 wherein the metal interlayer is comprised of spherical particles having diameters no greater than 500 A (0.05 μm).

23. Film structure of claim 22 wherein the diameter of the spherical particles is within the range 50–300 A (0.005–0.03 μm).

24. Film structure of claim 21 wherein the interlayer has a thickness of 500–10,000 A (0.05–1 μm) and the polymeric film has a thickness of 2–12 μm.

25. Film structure of claim 21 wherein the metal is selected from Cu, Ag, Au, Cd, Hg, Cr, Co, Ni, Pd, Pt and Sn.

26. Film structure of claim 25 wherein the polymeric film is comprised of a polyimide.

27. Film structure of claim 26 wherein the polymeric film is a polyimide of 4,4'-oxydianiline and pyromellitic dianhydride.

28. Film structure of claim 26 wherein the metal is Ag.

29. Film structure of claim 26 wherein the metal is Au.

30. Film structure of claim 26 wherein the metal is Cu.

31. Film structure of claim 21 wherein there are a plurality of metal interlayers.

32. Film structure of claim 21 wherein the metal interlayer has been formed by the process of claim 1.

33. Film structure of claim 21 wherein the metal interlayer has been formed by the process of claim 2.

34. Film structure of claim 21 wherein the metal interlayer has been formed by the process of claim 3.

* * * * *

UNITED STATES PATENT AND TRADEMARK OFFICE
CERTIFICATE OF CORRECTION

PATENT NO. : 4,512,855
DATED : April 23, 1985
INVENTOR(S) : Stephen Mazur

It is certified that error appears in the above—identified patent and that said Letters Patent is hereby corrected as shown below:

Column 8, equation 7, "$1 + \dfrac{D_e [P^-]^\circ}{n D_m K_s [M^{n+}]}$"

should read $-- \left( 1 + \dfrac{n D_m K_s [M^{n+}]}{D_e [P^-]^\circ} \right)^{-1} --$.

Signed and Sealed this

Twenty-fourth Day of September 1985

[SEAL]

Attest:

Attesting Officer

DONALD J. QUIGG

Commissioner of Patents and Trademarks—Designate